United States Patent [19]

Sawada

[11] Patent Number: 4,814,659
[45] Date of Patent: Mar. 21, 1989

[54] VARIABLE CROSS-SECTION PIEZOELECTRIC ACTUATOR

[75] Inventor: Daisaku Sawada, Gotenba, Japan

[73] Assignee: Toyota Jidosha Kabushiki Kaisha, Aichi, Japan

[21] Appl. No.: 141,784

[22] Filed: Jan. 11, 1988

[30] Foreign Application Priority Data

Feb. 23, 1987 [JP] Japan .................................. 62-39969

[51] Int. Cl.$^4$ ............................................. H01L 41/08
[52] U.S. Cl. .................................... 310/328; 310/323; 310/366; 310/369
[58] Field of Search ................. 310/328, 366, 367, 369

[56] References Cited

U.S. PATENT DOCUMENTS

| | | | |
|---|---|---|---|
| 3,501,099 | 3/1970 | Benson | 310/328 X |
| 4,384,230 | 5/1983 | Wisner | 310/328 X |
| 4,457,636 | 7/1984 | Nusser | 310/328 X |
| 4,460,842 | 7/1984 | Waanders et al. | 310/328 X |
| 4,510,412 | 4/1985 | Suda et al. | 310/328 |
| 4,570,098 | 2/1986 | Tomita et al. | 310/328 X |
| 4,633,120 | 12/1986 | Sato et al. | 310/328 |

FOREIGN PATENT DOCUMENTS 60-39878  3/1985  Japan .
60-39879  3/1985  Japan .

Primary Examiner—Mark O. Budd
Attorney, Agent, or Firm—Parkhurst, Oliff & Berridge

[57] ABSTRACT

A piezoelectric actuator having an active module formed by laminating a plurality of piezoelectric elements, in which the cross-sectional area of the element proximate the fixed end of the module is larger than that of the element proximate the movable end thereof. When the active module expands or contracts, the elements proximate the fixed end receive an inertial load of the elements proximate the movable end. Due to the above structure, a decrease in the inertial load can be realized, thereby preventing the elements near the fixed end from being damaged.

4 Claims, 5 Drawing Sheets

PRIOR ART

VARIABLE CROSS-SECTION PIEZOELECTRIC ACTUATOR

BACKGROUND OF THE INVENTION

The present invention relates to a piezoelectric actuator which has a piezoelectric module constructed by laminating a plurality of piezoelectric elements.

A piezoelectric material is characterized in that it expands and contracts with high speed response. Therefore, the material can be used for an actuator which requires high speed mechanical movement. This kind of actuator is generally constructed as shown in FIG. 5. Namely, the actuator has a piezoelectric module 5 in which a plurality of piezoelectric elements 1 are laminated together with electrode plates 3 sandwiched therebetween. This type of actuator is disclosed in Japanese Published Unexamined patent applications Nos. 60-39878 and 60-39879. In the piezoelectric module 5, as shown in FIG. 6, one alternate group of electrode plates 3 are connected to a positive electrode (not shown), and the other group of electrode plates 3 are connected to the negative electrode (not shown). One end 5a of the piezoelectric module 5 is fixed to a housing of the actuator. Upon application of an electrical charge, each piezoelectric element 1 expands or contracts so that another end 5b of the module 5 moves, thereby providing mechanical displacement. As shown in FIG. 6, in the prior art, all of the laminated piezoelectric elements 1 are unified in shape and cross section (in relation to the laminating direction).

However, the prior art piezoelectric actuator has certain drawbacks which will be explained below. When the piezoelectric module expands or contracts, each piezoelectric element 1 receives an inertial resistance load from the elements proximate the movable end 5b. If a large load and displacement are required, e.g., if the actuator is used for a fuel injection valve of a motor vehicle, the module is formed by laminating many piezoelectric elements together and is driven at a high frequency in order to attain high responsiveness. In this case, the piezoelectric elements 1 near the fixed end 5a receive an excessive inertial load, thereby damaging the elements.

SUMMARY OF THE INVENTION

It is an object of the present invention to provide a piezoelectric actuator in which a piezoelectric element near the fixed end is not damaged due to the excessive inertial load from the elements proximate the movable end.

Another object of the present invention is to make a highly displacive, highly responsive piezoelectric actuator which does not encounter the drawbacks encountered by the prior art piezoelectric actuators.

These and other objects of the present invention are achieved by a piezoelectric actuator including a plurality of piezoelectric elements which are laminated in series along an axis between a fixed end and a movable end of the piezoelectric actuator, wherein a cross-sectional area of the piezoelectric element proximate the fixed end is greater than a cross-sectional area of the piezoelectric element proximate the movable end.

The "piezoelectric element" denotes a crystal structure having the characteristic of exhibiting or producing a strain in response to excitation of the element by an electric field. In this sense, a piezoelectric ceramic consisting of stacked PZT (lead-zirconate-titanate), polymeric piezoelectric material, and crystal are piezoelectric elements.

The phrase "a cross-sectional area of the piezoelectric element proximate the fixed end is greater than a cross sectional area of the piezoelectric element proximate the movable end" is exemplified by the structure that the cross sectional areas of the elements are progressively decreased, either in a continuous fashion or a step-like fashion, from the fixed end side to the movable end side.

In the piezoelectric actuator of the present invention, the cross-sectional areas of the piezoelectric elements at the fixed end are larger than those of the elements at the movable end. Therefore, the weight of the elements near the movable end is smaller than that of the cylindrical type disclosed by the prior art. Consequently, even if the piezoelectric actuator expands or contracts at a high speed, an inertial resistance load applied to the elements near the fixed end is relatively small, thereby preventing damage of the elements near the fixed end.

BRIEF DESCRIPTION OF THE DRAWINGS

For a more complete understanding of the present invention and the advantages thereof, reference is now made to the following description taken in conjunction with the accompanying drawings in which.

DETAILED DESCRIPTION OF THE EMBODIMENT

Figure 1:
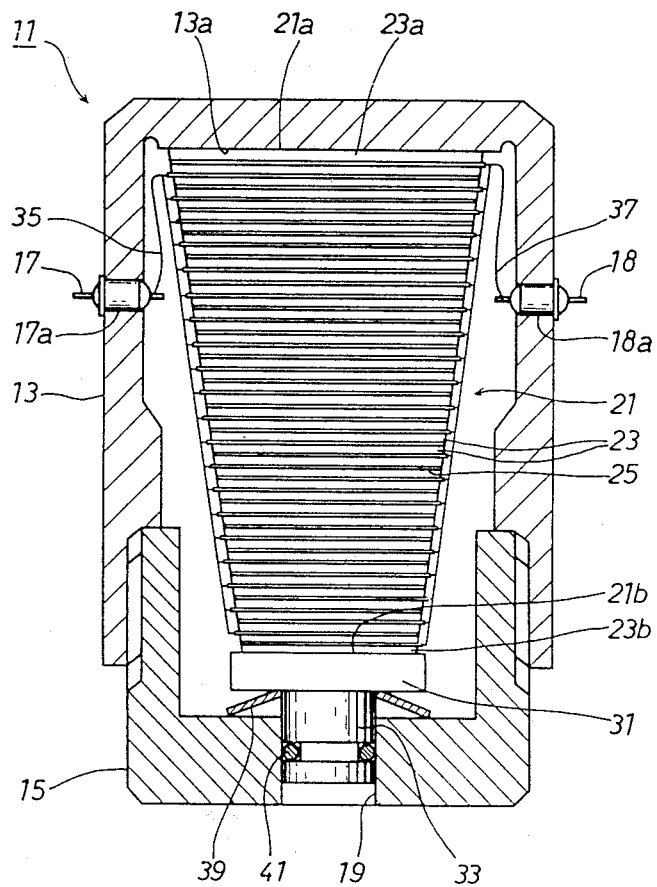
FIG. 1 is a sectional view of a piezoelectric actuator according to a first embodiment of the invention.
Figure 2A:
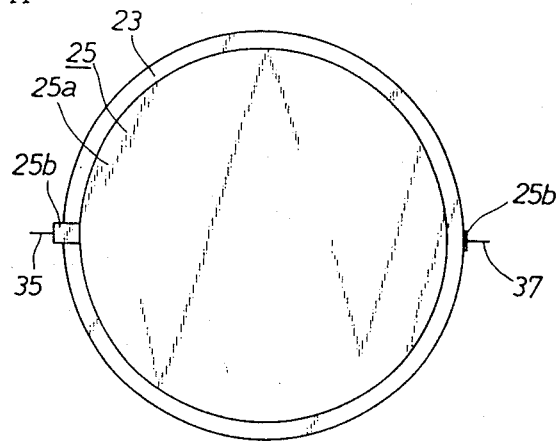
FIG. 2A is a plan view of a part of a piezoelectric module constituting the actuator of the first embodiment.
Figure 2B:
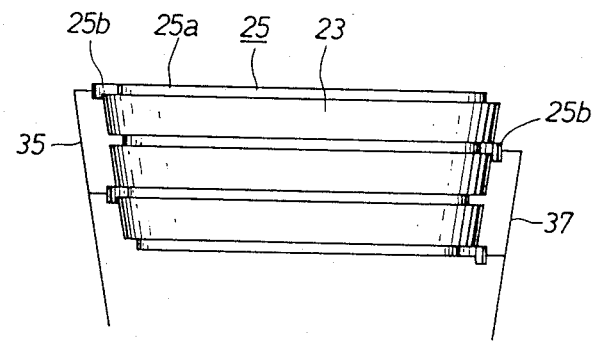
FIG. 2B is a side view of a portion of the piezoelectric module shown in FIG. 1.
Figure 2C:
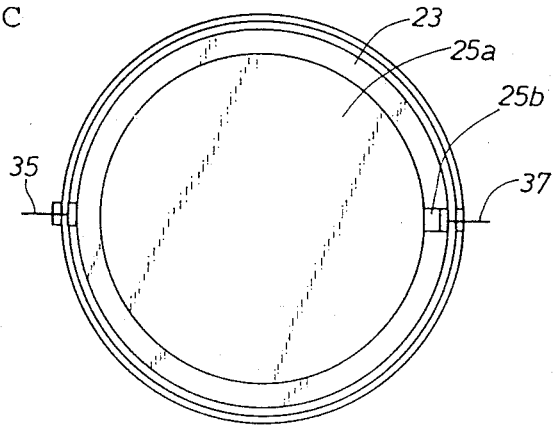
FIG. 2C is a bottom view of a portion of the piezoelectric module shown in FIG. 1.

As shown in FIG. 1, the outer shell of a piezoelectric actuator 11 is formed by an actuator housing 13 and a cap 15. Two electrodes 17 and 18 to which voltage is applied penetrate the opposite side walls of the housing 13 and are sealed therein via hermetic seals 17a and 18a, respectively. The cap 15 has, at its center, a cylindrical hole 19 in which a movable piston 33 is fitted. A piezoelectric module 21 resides in the actuator housing 13. The piezoelectric module 21 is constructed by laminating a plurality of piezoelectric discs 23 along a vertical axis of said module, with disc electrodes 25 sandwiched therebetween. The piezoelectric discs 23 can be made of PZT. An upper end 21a of the piezoelectric module 21 is fixed to an inner surface 13a of the actuator housing 13. A lower end 21b of the module 21 abuts on the movable piston 33 fitted in the cylinder hole 19 via a movable member 31. The cross-sectional areas of piezoelectric discs 23 continuously decrease from a disc 23a at the upper end 21a toward a disc 23b at the lower end 21b. As shown in FIGS. 2A and 2C, the disc electrode 25 inserted between the piezoelectric discs 23 consists of a circular electrode plate 25a and an end electrode 25b attached at an end face of the electrode plate 25a. As shown in FIG. 2B, the disc electrodes 25 are alternately stacked so that neighboring end electrodes 25b are placed 180° apart. Similarly to the piezoelectric discs 23, the cross-sectional areas of the disc electrodes 25 continuously decrease from the upper end 21a of the module 21 toward the lower end 21b thereof. The end electrodes 25b are alternately interconnected by lead wires 35 and 37 and connected to the electrode terminals 17 and 18, respectively.

As shown in FIG. 1, a belleville spring 39 is provided between the movable member 31 and the cap 15 so that the center hole of the belleville spring 39 receives the movable piston 33. The belleville spring 39 applies an initial load to the piezoelectric module 21. An O-ring 41 is provided around the piston 33 to form a seal between the cylinder hole 19 and the piston 33.

The decreasing manner of cross-sectional areas of the piezoelectric discs 23 is determined to assure durability of the disc 23 in view of the weight of the movable piston 33, the initial load applied by the belleville spring 39, the specific gravity of the discs 23, and the target responsiveness of the actuator 11.

In the piezoelectric actuator 11 of the above-described structure, upon application of negative voltage to the electrode terminal 17 and positive voltage to the electrode terminal 18, voltage is applied to all of the piezoelectric discs 23 so that the piezoelectric module 21 expands or contracts due to characteristics of the piezoelectric discs 23. By applying voltage and stopping the application, the piston 33 moves up or down in a vertical direction.

Figure 3:
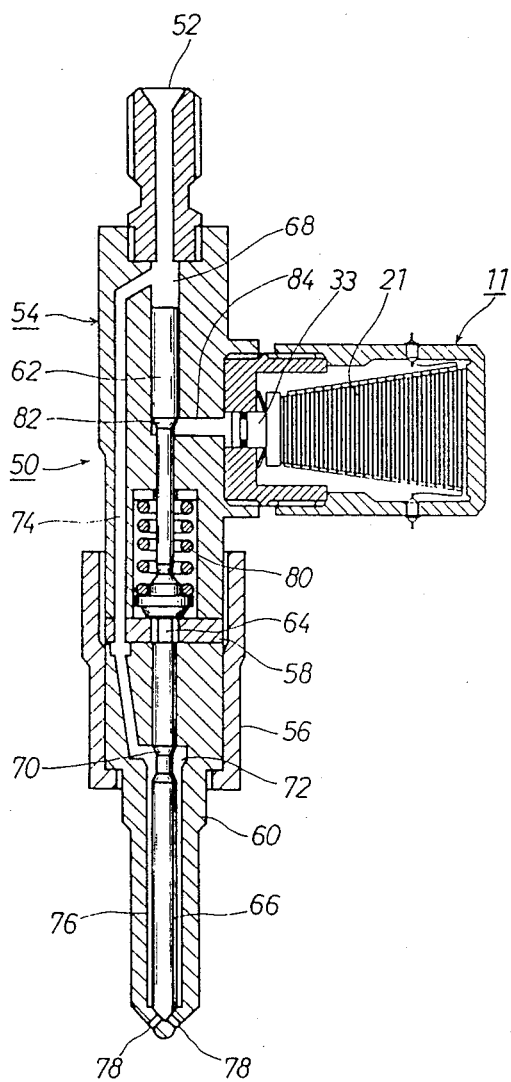
FIG. 3 is a cross-sectional view of a fuel injection valve for a diesel engine utilizing the actuator of the first embodiment.

Next, a fuel injection valve of a diesel engine in which the piezoelectric actuator 11 of the invention is used is described referring to FIG. 3.

As shown in FIG. 3, the fuel injection valve 50 consists of a fuel injection valve body 54, the piezoelectric actuator 11, a fuel inlet 52, and a nozzle 60. The fuel inlet 52 and the actuator 11 are directly fixed to the fuel injection valve body 54, and the nozzle 60 is attached to the valve body 54 by a nozzle holder 56 via a spacer 58.

A control rod 62, a push-down pin 64, and a needle 66, which are linearly disposed, are movably inserted into the fuel injection valve body 54, the spacer 58, and the nozzle 60. A fuel chamber 68 is formed above the control rod 62. Fuel pressurized by a pump (not shown) is supplied to the fuel chamber 68 from the fuel inlet 52. Therefore, fuel pressure within the fuel chamber 68 acts on the upper surface of the control rod 62. The needle 66 has a beveled pressure receiving surface 70 around which a needle pressure chamber 72 is formed. The needle pressure chamber 72 is connected to the fuel chamber 68 via a fuel path 74, and is also connected to nozzle holes 78 at the tip of the nozzle 60 via an annular fuel path 76 around the needle 66. The fuel injection valve body 54 has a spring 80 which biases the push-down pin 64 and the needle 66 downward. The control rod 62 has a beveled pressure receiving surface 82 around which a control rod pressure chamber 84 is formed. Pressure within this cylindrical chamber 84 is changed by the movable piston 33 of the actuator 11.

When work oil (i.e. fuel to be injected) in the control rod pressure chamber 84 is not pressurized, the needle 66 receives a downward force acting on the upper surface of the control rod 62, another downward force by the spring 80, and an upward force acting on the pressure surface 70. The cross-sectional area of the control rod 62, bias force of the spring 80, and area of the pressure surface 70 are determined so that the sum of the two downward forces is slightly larger than the upward force in a normal state. Therefore, the needle 66 is usually biased downward, thereby shutting off the nozzle holes 78.

Upon application of voltage to the actuator 11, the piezoelectric module 21 expands, thus moving the movable piston 33 in a direction toward the control rod pressure chamber. As a result, oil pressure within the control rod pressure chamber 84 is increased. At this time, since an upward force is applied to the pressure surface 82 of the control rod 62, the control rod 62 is lifted. The needle 66 is thus lifted so that fuel is injected from the nozzle hole 78.

When the application of voltage to the actuator 11 is stopped, the piezoelectric module 21 contracts. As a result, oil pressure within the control rod pressure chamber 84 is decreased. Therefore, the control rod 62 and the needle 66 move down, thereby stopping fuel injection.

As described above, in the piezoelectric actuator 11 of this embodiment, the cross-sectional area of the piezoelectric disc 23a at the fixed end 21a is the largest of all discs, and the cross-sectional areas of the discs 23 become smaller toward the movable end 21b, and the cross-sectional areas of the disc 23b at the movable end 21b is the smallest of all the discs. Therefore, the weight of the discs 23 near the movable end 21b is smaller than that of the prior straight cylindrical type. Consequently, even if the piezoelectric actuator 21 expands or contracts at high speed, the inertial load applied to the discs 23 near the fixed end 21a is relatively small, thereby preventing the discs 23 near the end 21b from being damaged. Alternatively, since the cross-sectional areas of the discs 23 near the movable end 21b are relatively small, the actuator 11 is smaller and not as heavy as the prior art actuator described above. Further, since the volume of the piezoelectric module 21 is also smaller, electricity consumption of the module 21 can be decreased.

As described above, since the inertial load applied to the piezoelectric discs 2 near the fixed end 21a is small, in case the same response speed is required, the cross-sectional areas of the discs 23 near the fixed end 21a can be made smaller. Thus, the miniaturization, decreased weight and the decreased amount of electricity consumption of the actuator 11 can be further promoted.

Figure 4:
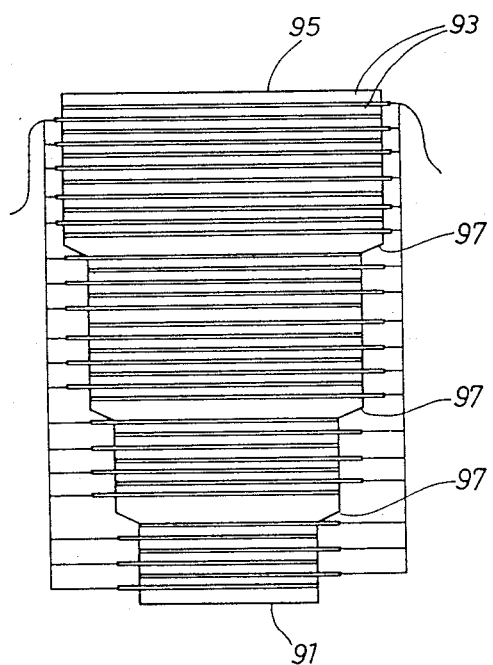
FIG. 4 is a side view of the piezoelectric module constituting an actuator of a second embodiment of the invention.
Figure 5:
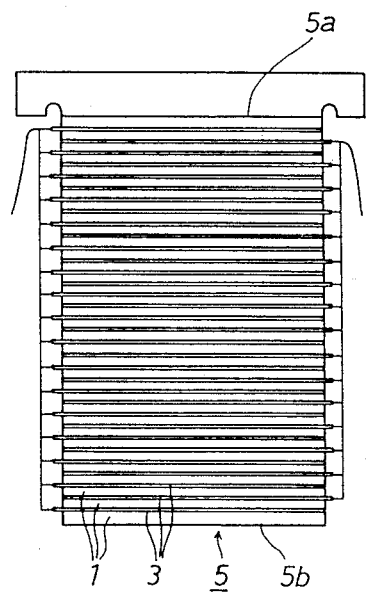
FIG. 5 is a side view of a prior art piezoelectric module.
Figure 6:
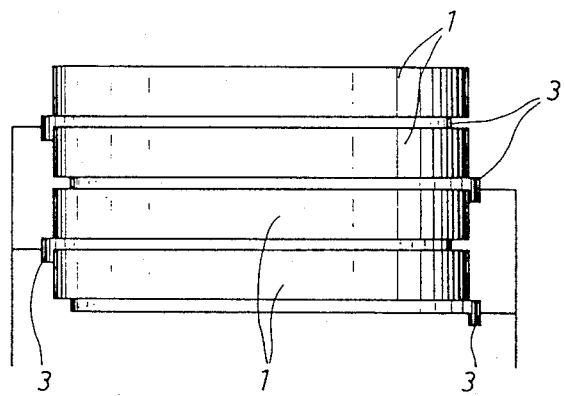
FIG. 6 is a partially enlarged view of the module shown in FIG. 5.

Next, the second embodiment of the invention is described. The second embodiment is different from the first embodiment only in the shape of the piezoelectric module. The structure of the fuel injector is the same as the first embodiment. As shown in FIG. 4, the cross-sectional areas of piezoelectric discs 93 decrease toward a movable end 91, not in a continuous fashion but, rather, in a step-like fashion by using boundary discs 97. Therefore, in the piezoelectric actuator of this embodiment, as well as that of the first embodiment, the piezoelectric discs 93 near a fixed end 95 of the piezoelectric module are prevented from being damaged, and also the miniaturization and decreased weight of the actuator, and the decreased electricity consumption can be realized. Additionally, since the cross-sectional areas of the piezoelectric discs 93 change not in a continuous fashion but, rather, by several steps, the actuator of the second embodiment is easier to manufacture than that of the first embodiment.

Since stress (load per unit area) will be concentrated on the boundary discs 97, in this embodiment, the thickness of the boundary discs 97 should be greater than the other discs 93, thereby preventing the disc 97 from being damaged.

Although the invention has been described and illustrated in detail, it is to be clearly understood that the same is by way of illustration and example only and is not taken by way of limitation. The spirit and scope of this invention are to be limited only by the terms of the appended claims.

What is claimed is:

1. A piezoelectric actuator comprising a plurality of piezoelectric element coaxially laminated in series along a central axis of said piezoelectric actuator between a fixed end and a movable end thereof, wherein the cross-sectional areas of the piezoelectric elements, in planes perpendicular to said central axis, continuously decrease from said fixed and toward said movable end, such that the cross-sectional area of a piezoelectric element proximate said fixed end is greater than the cross-sectional area of a piezoelectric element proximate said movable end.

2. A fuel injector comprising a nozzle hole, a needle bar abutting said nozzle hole and a piezoelectric actuator for controlling the movement of said needle bar, said piezoelectric actuator comprising a plurality of piezoelectric elements coaxially laminated in series along a central axis of said piezoelectric actuator between a fixed end and a movable end thereof, wherein said cross-sectional areas of the piezoelectric elements, in planes perpendicular to said central axis, continuously decrease from said fixed and toward movable end, such that the cross-sectional area of a piezoelectric element proximate said fixed end is greater that the cross-sectional area of a piezoelectric element proximate said movable end.

3. A piezoelectric actuator comprising a plurality of piezoelectric elements coaxially laminated in series along a central axis of said piezoelectric actuator between a fixed end and a movable end thereof, said plurality of piezoelectric elements being laminated in a plurality of groups, each of said groups including a plurality of piezoelectric element having the same cross-sectional area in a plane perpendicular to said central axis, wherein the cross-sectional areas of said groups continuously decrease from said fixed end toward said movable end, such that the cross-sectional area of a group proximate said fixed end is greater than the cross-sectional area of a group proximate said movable end.

4. A piezoelectric actuator according to claim 3, wherein a piezoelectric element at a boundary between each of said groups has an axial dimension which is greater than an axial dimension of piezoelectric elements within the groups.

* * * * *